United States Patent [19]

Yamamoto et al.

[11] Patent Number: 4,859,364
[45] Date of Patent: Aug. 22, 1989

[54] CONDUCTIVE PASTE COMPOSITION

[75] Inventors: Yasuo Yamamoto; Akira Inaba; Takashi Kitagaki, all of Tokyo, Japan

[73] Assignee: E. I. Du Pont de Nemours and Company, Wilmington, Del.

[21] Appl. No.: 199,843

[22] Filed: May 25, 1988

[51] Int. Cl.⁴ .............................................. H01B 1/06
[52] U.S. Cl. .................................... 252/512; 252/514; 252/520; 252/518
[58] Field of Search ............... 252/512, 514, 520, 518

[56] References Cited

U.S. PATENT DOCUMENTS

| | | | |
|---|---|---|---|
| 4,450,188 | 5/1984 | Kawasumi | 427/217 |
| 4,521,329 | 6/1985 | Siuta et al. | 252/512 |
| 4,652,465 | 3/1987 | Koto et al. | 252/514 |
| 4,687,597 | 8/1987 | Siuta | 252/512 |
| 4,714,645 | 12/1987 | Kawasumi | 428/209 |

FOREIGN PATENT DOCUMENTS 2152060 7/1985 U.S.S.R. .

OTHER PUBLICATIONS

Derwent Abstract of J58-037166.

Primary Examiner—Josephine Barr

[57] ABSTRACT

A conductive paste composition consisting of an admixture of: (a) conductive metal particles having an average particle size of about 0.3 to 1.0 μm; (b) particles uniformly coated with a conductive metal and having an average particle size of not more than 1 μm; and (c) an organic medium, the admixture of particles (a) and (b) being dispersed in the organic medium.

7 Claims, 1 Drawing Sheet

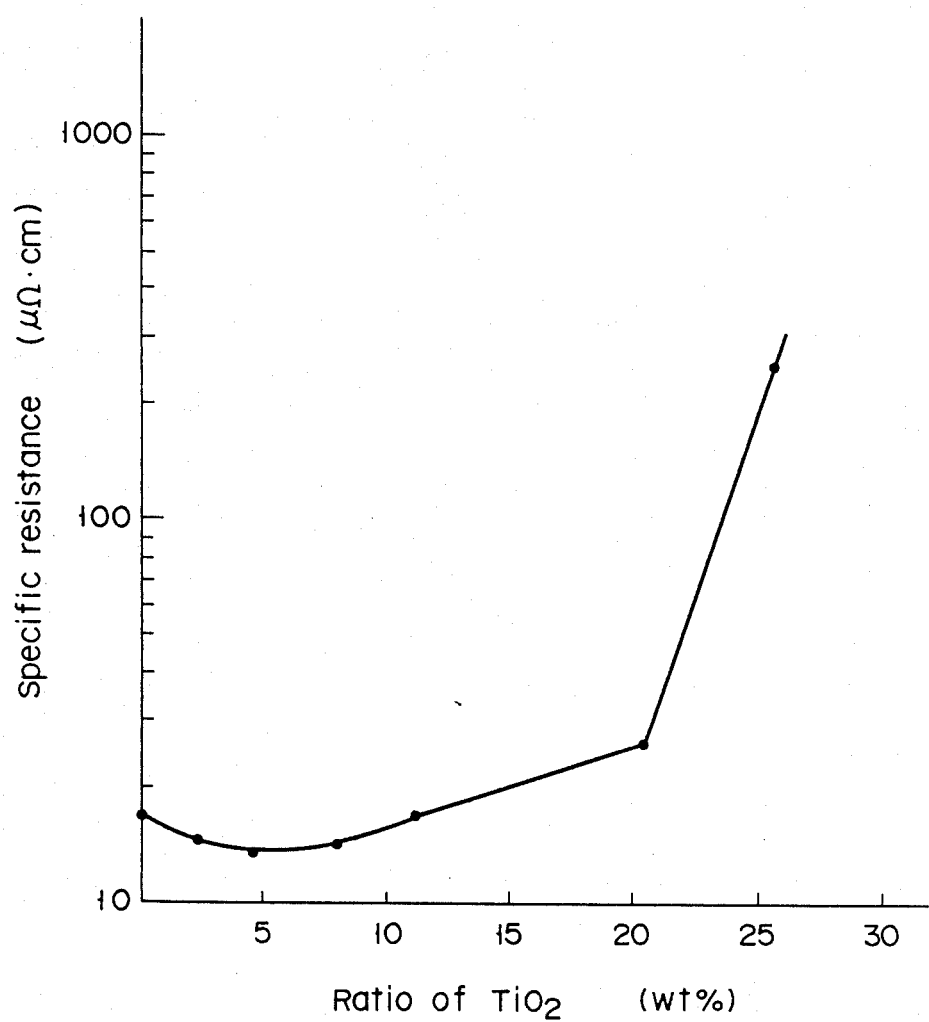
F I G. 1

CONDUCTIVE PASTE COMPOSITION

BACKGROUND OF THE INVENTION

1. Field of the Invention

The present invention relates to a conductive paste composition for manufacturing a thick conductive film such as a thick film circuit and/or a ceramic capacitor.

2. Description of the Related Art

Conventionally, as an internal electrode paste for electronic parts such as a ceramic capacitor, a metal paste containing a conductive metal powder is most frequently used. The paste can be prepared by kneading the conductive metal powder, an appropriate binder, and a solvent. The paste is applied to a substrate such as a ceramic green sheet by screen printing, and is laminated and pressed. Thereafter, the resultant structure is fired at a high temperature of 1,000° C. to 1,350° C., thereby preparing an internal electrode film.

Normally, as a conductive material for the conductive paste, particles of noble metals such as gold, palladium, platinum, and the like are used. In the conventional electrode, however, a high conductivity cannot be obtained, and the thickness of the electrode must be increased to maintain a necessary conductivity. For this reason, it is difficult to realize compact, low-cost electronic parts.

SUMMARY OF THE INVENTION

It is therefore an object of the present invention to provide a conductive paste composition which uses a small amount of a conductive material and has a high conductivity.

According to the present invention, there is provided a conductive paste composition consisting of an admixture of: (a) conductive metal particles having an average particle size of about 0.3 to 1.0 $\mu$m; (b) particles uniformly coated with a conductive metal and having an average particle size of not more than 1 $\mu$m; and (c) an organic medium in which the admixture of particles (a) and (b) is dispersed.

The present inventors made extensive studies to solve the problem of the conductivity of the conductive paste composition described above. As a result, the inventor found that "conductive-metal coated particles" are mixed with conductive metal particles so as to solve the conventional problem. Note that the conductive-metal coated particles are particles where particles of metal oxides etc. are used as cores, and the core particles are uniformly coated with a conductive metal. In particular, palladium particles having an average particle size of 0.3 to 1.0 $\mu$m are mixed with palladium-coated TiO$_2$ particles having an average particle size of 1 $\mu$m or less, so that a conductive film having a better conductivity than a composition containing only palladium particles can be obtained. As a result of the improved conductivity, a ceramic capacitor internal electrode having good dielectric loss tangent and E.S.R. characteristics can be formed.

A. Conductive Metal Particle

Metals for conductive metal particles used in the present invention include precious metals such as palladium, silver, platinum, and the like and their alloys such as Pd/Ag, as well as a conductive metal such as copper. When copper is used, a firing treatment (to be described later) is preferably performed in a reducing atmosphere. Among the above-mentioned conductive metals, precious metals are preferable, and palladium is most preferable.

The average particle size of the conductive metal particles preferably falls within the range of about 0.3 $\mu$m to about 1.0 $\mu$m. If the particle size of the conductive metal particles is larger than 1.0 $\mu$m, film continuity is degraded and hence the resistance is increased. On the other hand, if the particle size is smaller than 0.3 $\mu$m, particles (particularly, Pd particles) are agglomerated and are easily converted to particle agglomerates of 1 $\mu$m or more. After such agglomerations of particles are dispersed as a paste, they can no longer have a particle size of 1 $\mu$m or less. Therefore, the filling properties of particles are unpreferably impaired, and the fluidity of the paste is degraded. The paste having such particle agglomerates has poor hiding power, and an electrode film after firing may be discontinued.

Conductive particles used in the present invention preferably have good sphericity and uniformity.

B. Conductive-Metal Coated Particle

The conductive-metal coated particles used in the present invention are particles where particles of metal oxides etc. are used as cores, and the core particles are uniformly coated with a conductive metal.

TiO$_2$ particles are preferable as cores. Instead, particles of BaTiO$_3$, ceramic prepared such that BaTiO$_3$ and oxides are mixed, fired and then milled, Al$_2$O$_3$, SiO$_2$, and high-melting point glass, and the like can be used.

Conductive metals for coating include precious metals such as palladium, silver, platinum, and the like and their alloys such as Pd/Ag, as well as conductive metals such as copper. A coating metal is preferably of the same type of metal as that of the conductive metal particles.

The average particle size of the conductive-metal coated particles is preferably below about 1 $\mu$m or less. Basically, the conductive-metal coated particles should be smaller than the conductive metal particles. If the conductive-metal coated particles are too larger than the conductive metal particles, sintering between adjacent conductive metal particles is suppressed so as to increase the resistance of a conductive film. The conductive-metal coated particles ideally have the particle size enough to be caught in gaps between adjacent conductive metal particles in the packing state.

As the preferable conductive-metal coated particles used in the conductive paste composition of the present invention, TiO$_2$ particles having an average particle size of 1 $\mu$m or less and preferably, about 0.02 $\mu$m, are used as cores, and palladium is coated thereon to provide particles having an average particle size of 1 $\mu$m or less and preferably, about 0.02 $\mu$m.

The conductive-metal coated particles used in the present invention can be prepared by a method described in U.S. Pat. No. 4,450,188, Japanese Patent Disclosure (Kokai) Nos. 56-150101, 57-41301, 58-37166, and 58-68918. The average particle size used in the present invention indicates "volume-accumulated 50% particle size (D$_{50}$)" and can be measured by a "microtrack particle size analyzer" (NIKKISO CO., LTD)." or the like.

In the conductive paste composition of the present invention, the total content of oxides is set to fall within the range of 1 to 11% by weight with respect to the total content of the conductive metal particles and conductive-metal coated particles, and preferably within the range of 4 to 8% by weight.

C. Organic Medium

The main purpose of the organic medium is to serve as a vehicle for dispersion of the particles or finely-divided solids of the composition in such form that it can readily be applied to a ceramic or other substrate. Thus, the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of inert liquids can be used as organic medium. The organic medium for most thick film compositions is typically a solution of resin in a solvent and frequently a solvent solution containing both resin and thixotropic agent. The solvent usually boils within the range of 130°-350° C.

By far, the most frequently used resin for this purpose is ethyl cellulose. However, resins such as ethylhydroxyethyl cellulose, wood rosin, mixtures of ethyl cellulose and phenolic resins, polymethacrylates of lower alcohols, and monobutyl ether of ethylene glycol monoacetate can also be used.

The most widely used solvents for thick film applications are terpenes such as alpha- or delta-terpineol or mixtures thereof with other solvents such as kerosene, dibutylphtalate, butyl carbitol, butyl carbitol acetate, hexylene glycol, and high boiling alcohols and alcohol esters. Various combinations of these and other solvents are formulated to obtain the desired viscosity and volatility requirements for each application.

Among the thixotropic agents which are commonly used are hydrogenated castor oil and derivatives thereof and ethyl cellulose. It is, of course, not always necessary to incorporate a thixotropic agent since the solvent/resin properties coupled with the shear thinning inherent in any suspension may alone by suitable in this regard.

The ratio of organic medium to solids in the paste dispersions can vary considerably and depends upon the manner in which the dispersion is to be applied and the kind of organic medium used. Normally, to achieve good coverage the dispersions will contain complementary by weight 60-90% solids and 40-10% organic medium.

The pastes are conveniently prepared on a three-roll mill. The viscosity of the pastes is typically within the following ranges (table 1) when measured at room temperature on Brookfield viscometers at low, moderate and high shear rates:

TABLE 1

| Shear Rate (Sec$^{-1}$) | Viscosity (Pa. S) | |
| --- | --- | --- |
| 0.2 | 100–5000 | — |
| | 300–2000 | Preferred |
| | 600–1500 | Most Preferred |

TABLE 1-continued

| Shear Rate (Sec$^{-1}$) | Viscosity (Pa. S) | |
| --- | --- | --- |
| 4 | 40–400 | — |
| | 100–250 | Preferred |
| | 140–200 | Most Preferred |
| 384 | 7–40 | — |
| | 10–25 | Preferred |
| | 12–18 | Most Preferred |

The amount and type of organic medium (vehicle) utilized is determined mainly by the final desired formulation viscosity and print thickness.

D. Formulation of Composition and its Application

The conductive paste composition of the present invention can be prepared in such a manner that conductive metal particles, conductive-metal coated particles, and an organic medium are mixed and dispersed by a three-roll mill. This paste can be applied to an alumina substrate by screen printing and can be fired at a temperature of 1,350° C., thereby obtaining an electrode film.

E. Test Procedures

The test for the conductivity of the conductive paste composition is conducted as follows.

Materials are mixed and dispersed by a three-roll mill to obtain a paste composition. Then, paste composition is screen-printed on an alumina substrate (96% alumina, 25 mm×25 mm, thickness=0.635 mm, available from KYOCERA COPR). As a screen, a stainless steel screen having a wire diameter of 28 microns and a 325 mesh is used. A printed pattern is a zigzag rectangular pattern, so that an electrode having a width of 0.5 mm, a length of 100 mm and after firing, a thickness of about 3 $\mu$m, is formed.

Thereafter, the printed alumina substrate is fired. A firing temperature is increased from room temperature to 1,350° C. within 2 hours, a temperature of 1,350° C. is maintained for 1 hour, and thereafter, the temperature is decreased to room temperature within 2 hours.

The resistance, the thickness, the width, and the length of the resultant electrode are measured, and a specific resistance is calculated from these measured values.

BRIEF DESCRIPTION OF THE DRAWING

FIG. 1 shows the relationship between the weight percent of TiO$_2$ with respect to the total weight of Pd and TiO$_2$ and its specific resistances in electrode films of samples in examples of the present invention.

DETAILED DESCRIPTION OF THE PREFERRED EMBODIMENTS

EXAMPLES 48 to 100 parts by weight of palladium particles, 0 to 52 parts by weight of palladium-coated TiO$_2$ particles, 9 parts by weight of ethyl cellulose, and 73 parts by weight of terpineol were used to prepare pastes, of samples No. 1 to No. 7 shown in Table 2 and the pastes were respectively printed on alumina substrates in accordance with the method described above. The printed substrates were fired at a temperature of 1,350° C. to obtain samples Nos. 1 to 7.

For a comparative example, a paste was prepared from 94 parts by weight of palladium particles, 6 parts by weight of TiO$_2$ powder, 9 parts by weight of ethyl cellulose, and 73 parts by weight of terpineol, was printed on the substrate, and was fired, under the same conditions as samples Nos. 1 to 7.

The specific resistances of the electrode films of these samples were measured.

The palladium particles used have $D_{50}=0.88$ μm and palladium-coated $TiO_2$ particles were available from Kawasumi Gijitsu Kenkyusho as trade name "Pd26-Ti22 (Pd: 26% by volume, $TiO_2$: $2\times10^2$ Å)"

The results are shown in Table 2. FIG. 1 shows the relationship between the percent by weight of $TiO_2$ with respect to the total weight of Pd and $TiO_2$ and their specific resistances in the electrode films in samples Nos. 1 to 7.

TABLE 2

| Sample | Pd Particles (parts by weight) | Pd-coated $TiO_2$ Particles (Parts by weight) | Specific Resistance (μΩ · cm) | Ratio of $TiO_2$ (wt. %) |
| --- | --- | --- | --- | --- |
| 1 | 100 | 0 | 16.5 | 0 |
| 2 | 95 | 5 | 14.5 | 2.5 |
| 3 | 91 | 9 | 13.6 | 4.5 |
| 4 | 84 | 16 | 14.0 | 8.0 |
| 5 | 77 | 23 | 17.0 | 11.5 |
| 6 | 58 | 42 | 25.2 | 21.0 |
| 7 | 48 | 52 | 250.0 | 26.0 |
| Comparative Example | 94 | 6* *($TiO_2$ Particle) | 20.1 | 6.0 |

As can be seen from FIG. 1, the specific resistance of the electrode film exhibits the minimum value with respect to the amount of $TiO_2$ of the palladium-coated $TiO_2$ particles. The electrode film containing about 1 to 11% by weight of $TiO_2$ can have a higher conductivity than that of electrode film of the 100% palladium.

As described above, when the conductive paste composition according to the present invention is used, an inexpensive conductive film having good characteristics can be obtained.

What is claimed is:

1. A conductive thick film paste consisting of (a) 60–90% by weight of an admixture of solids consisting of (1) 89–99% by weight, basis solids, of conductive metal particles having an average particle size of 0.3–1.0 μm, and (2) 11–1% by weight, basis solids, of metal oxide particles coated with a conductive metal, the coated particles having a particle size of no more than 1 μm, the admixture being dispersed in (b) 40–10% by weight of an organic medium.

2. A conductive paste composition according to claim 1, wherein the particles(b) are $TiO_2$ particles uniformly coated with the conductive metal.

3. A conductive paste composition according to claim 2, wherein the conductive metals of the particles (a) and (b) are of the same.

4. A conductive paste composition according to claim 3, wherein the conductive metal is a precious metal.

5. A conductive paste composition according to claim 4, wherein the precious metal is palladium.

6. A conductive paste composition according to claim 5, wherein a total content of $TiO_2$ in the composition falls within a range of 1 to 11% by weight with respect to a total content of the particles (a) and (b).

7. A conductive paste composition according to claim 5, wherein a total content of $TiO_2$ in the composition falls within a range of 4 to 8% by weight with respect to a total content of the particles (a) and (b).

* * * * *